(12) United States Patent
Topalski et al.

(10) Patent No.: US 10,787,733 B2
(45) Date of Patent: Sep. 29, 2020

(54) DEVICE FOR FORMING COATINGS ON SURFACES OF A COMPONENT, BAND-SHAPED MATERIAL, OR TOOL

(71) Applicant: Thyssenkrupp Steel Europe AG, Duisburg (DE)

(72) Inventors: Slavcho Topalski, Dortmund (DE); Thomas Stucky, Dortmund (DE); Axel Zwick, Hagen (DE); Klaus Kratzenberg, Luenen (DE)

(73) Assignee: THYSSENKRUPP STEEL EUROPE AG., Duisburg (DE)

( * ) Notice: Subject to any disclaimer, the term of this patent is extended or adjusted under 35 U.S.C. 154(b) by 425 days.

(21) Appl. No.: 15/512,430

(22) PCT Filed: Sep. 17, 2015

(86) PCT No.: PCT/EP2015/071327
§ 371 (c)(1),
(2) Date: Mar. 17, 2017

(87) PCT Pub. No.: WO2016/042079
PCT Pub. Date: Mar. 24, 2016

(65) Prior Publication Data
US 2017/0283937 A1    Oct. 5, 2017

(30) Foreign Application Priority Data
Sep. 18, 2014    (DE) .................. 10 2014 218 770

(51) Int. Cl.
*C23C 16/00*    (2006.01)
*C23C 14/24*    (2006.01)
(Continued)

(52) U.S. Cl.
CPC .............. *C23C 14/24* (2013.01); *C23C 14/16* (2013.01); *C23C 14/228* (2013.01);
(Continued)

(58) Field of Classification Search
CPC ..................................................... C23C 14/243
(Continued)

(56) References Cited

U.S. PATENT DOCUMENTS 3,099,555 A * 7/1963 Teitel .................. C22B 60/0213
420/3
3,447,951 A    6/1969 Ashburn
(Continued)

FOREIGN PATENT DOCUMENTS

DE    10 2011 002 183 A1    4/2012
GB          972 183 A    10/1964
(Continued)

*Primary Examiner* — Keath T Chen
(74) *Attorney, Agent, or Firm* — Jacobson Holman, PLLC.

(57) ABSTRACT

A device for forming coatings on surfaces of a component, band-shaped material, or tool, in which at least one wire-shaped or band-shaped material is used for forming the coating and that is/are connected to a direct electrical current source, wherein an electric arc is formed between wire-shaped materials or between one wire-shaped or band-shaped material and one anode or cathode, wherein wire-shaped or band-shaped material may be fed by means of a feed device; and melted and/or evaporated material of the wire-shaped or band-shaped material flows, by means of a gas jet of a gas or gas mixture, through an inlet into the interior of a chamber that can be heated to a temperature that is at least equal to the evaporation temperature of the at least one material used for the coating or of the material with the highest evaporation temperature, and the material(s) completely evaporates and exits through at least one opening present on the chamber and impinges on the surface to be coated of the component or tool for forming the coating.

17 Claims, 1 Drawing Sheet

(51) Int. Cl.
*C23C 14/56* (2006.01)
*C23C 14/22* (2006.01)
*C23C 14/16* (2006.01)
*C23C 14/54* (2006.01)

(52) U.S. Cl.
CPC .......... *C23C 14/243* (2013.01); *C23C 14/246* (2013.01); *C23C 14/541* (2013.01); *C23C 14/562* (2013.01)

(58) Field of Classification Search
USPC ........................................................ 118/726
See application file for complete search history.

(56) References Cited

U.S. PATENT DOCUMENTS

| | | | | |
|---|---|---|---|---|
| 4,013,463 | A * | 3/1977 | Leder | C23C 14/32 |
| | | | | 204/192.26 |
| 4,016,389 | A * | 4/1977 | White | C23C 14/32 |
| | | | | 118/723 VE |
| 5,238,475 | A * | 8/1993 | Keuschnigg | B01D 45/16 |
| | | | | 55/349 |
| 5,470,784 | A * | 11/1995 | Coleman | C23C 16/503 |
| | | | | 118/719 |
| 6,042,707 | A * | 3/2000 | Moslehi | C23C 14/22 |
| | | | | 118/723 FE |
| 6,210,755 | B1 | 4/2001 | Fuchs et al. | |
| 6,251,233 | B1 * | 6/2001 | Plester | C23C 14/243 |
| | | | | 118/723 VE |
| 6,440,197 | B1 * | 8/2002 | Conrad | A47L 9/1608 |
| | | | | 55/418 |
| 7,194,197 | B1 * | 3/2007 | Wendt | C23C 14/0021 |
| | | | | 392/389 |
| 2003/0113481 | A1 | 6/2003 | Huang et al. | |
| 2004/0065170 | A1 | 4/2004 | Wu et al. | |
| 2012/0018407 | A1 | 1/2012 | Schramm et al. | |
| 2013/0217164 | A1 | 8/2013 | Kang et al. | |
| 2016/0260507 | A1 * | 9/2016 | Lee | G21C 9/004 |

FOREIGN PATENT DOCUMENTS

| | | |
|---|---|---|
| JP | 2000-144381 | 5/2000 |
| JP | 2012-521878 | 9/2012 |

* cited by examiner

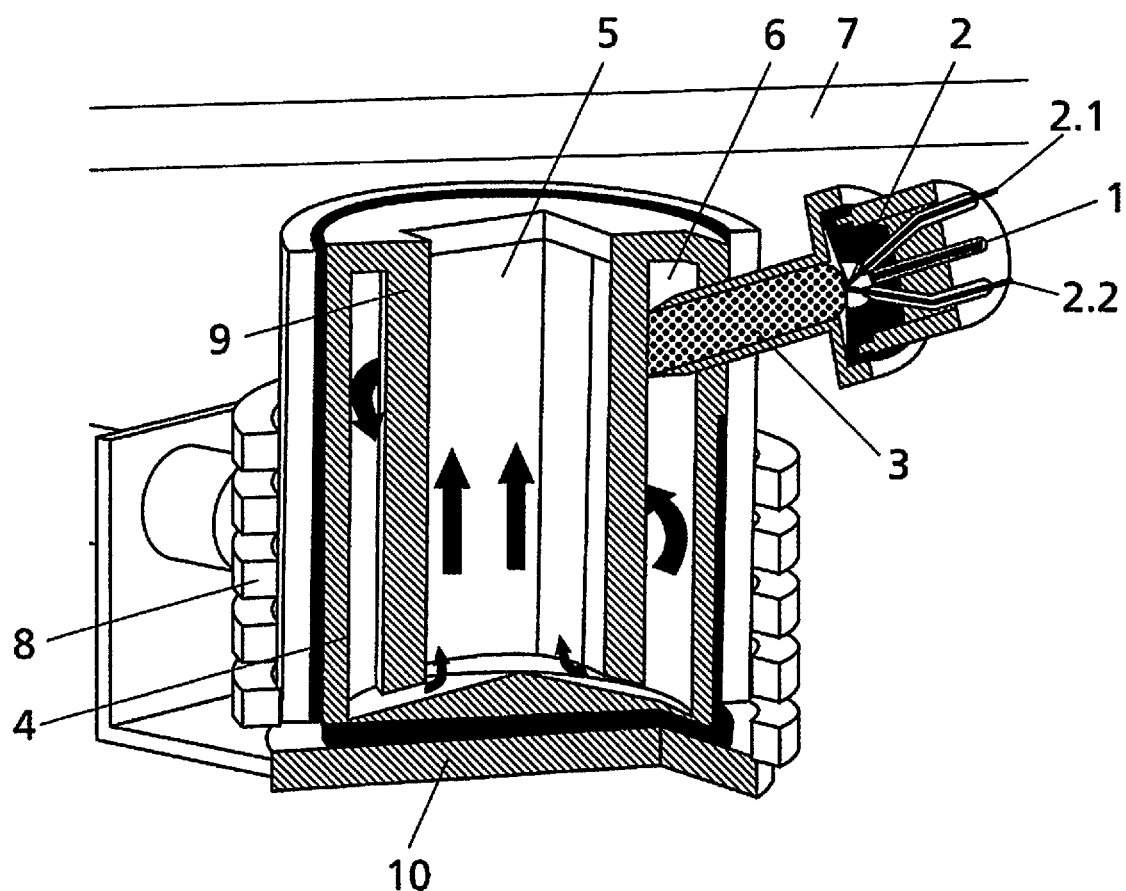

DEVICE FOR FORMING COATINGS ON SURFACES OF A COMPONENT, BAND-SHAPED MATERIAL, OR TOOL

The invention relates to a device for forming coatings on surfaces of a component, band-shaped material, or tool. Different coatings that in particular form a high temperature-resistant, anti-wear or anti-corrosion layer may be formed.

Up to now there has not been any well controllable coating method with continuous material feed for continuous coating of large surfaces, e.g. rapidly running steel band materials, in which the coating occurs by means of vapor deposition, which method is economically competitive with conventional coating methods and with which it is also possible to form coatings from high melting point materials.

Thus for decades coating has been performed using vapor deposition methods that work with a negative pressure, such as e.g. the known Chemical Vapor Deposition (CVD) and Physical Vapor Deposition (PVD) methods, in batch processes for finishing components and tools with high-function layers (anti-wear, optical and magnetic applications, microelectronics). While CVD methods have not become widespread for continuous processes due to difficulties associated with handling the precursors and treating waste gases, today in many fields PVD methods are absolutely necessary for finishing flat products (mirrors, architectural glass) and sheet and rolled goods (packaging films, copper and aluminum sheet).

The critical advantage of PVD methods, in which the coating material is shifted to the vapor phase using physical methods, is their very high flexibility with respect to layer composition and structure, which permits, for instance, a targeted layer design. Therefore there have been efforts, and also corresponding patents, since the 1980s, e.g. to coat an electric band with titanium nitride in a continuous process in order to reduce hysteresis losses.

Typically crucibles that are filled with a solid or liquid metal and that are evaporated with an electron beam gun are used during vapor deposition of higher melting point metals, such as e.g. titanium. In these cases the continuous material feed into the crucible is problematic. Due to the accessibility issues for the electron beam, above the crucible the material may not be conducted through hot channels with low losses to the surface of the respective component or tool that is to be coated. Therefore scatter coatings remain that after a brief period must be cleaned and supplied to a recycling process, which involves great complexity and leads to lost time that cannot be used productively.

In the field of producing anti-corrosion layers made of zinc-magnesium alloys by means of PVD processes, as well, there are already a number of well-established technical solutions. For instance, co-vapor deposition of Zn and Mg or vapor phase deposition of layer systems that comprise a plurality of alternating successive layers of Zn and Mg is used. It has also been suggested that an additional thermal follow-on treatment be used.

Also known is using PVD coating methods with zinc coatings and zinc alloy coatings. A system that comprises two jet evaporators and one mixing chamber may be used. The metals in the evaporators are heated inductively, the metal vapor formed is directed into a mixing chamber and from there onto the surface of a running band-shaped component. Although this method permits high rates, due to the large quantities of molten material it is extremely thermally sluggish, which renders the regulation of an industrial process much more difficult. In addition, all of the vapor-contacted surfaces must be kept above the condensation temperature for the metals used, which can hardly be handled, especially for higher melting point metals. Moreover, the production of metal alloy layers with a defined composition is difficult for technical process reasons. There is also the problem of continuously feeding the materials into the evaporator. Thus there are e.g. no materials that withstand liquid magnesium for lengthy periods.

Another method is based on electromagnetic levitation. In this method, wire material is fed sideways into a quartz tube and, while being held suspended, is melted and evaporated by a coil that encloses the quartz tube. This method was successfully tested on low melting point metals, but with metals that melt at higher temperatures it is not possible to deposit the layer uniformly on a surface. In addition, droplets (larger particles) are incorporated into the layer formed on the respective surface, and this is not acceptable for anti-corrosion layers, anti-wear layers, and layers subjected to slide wear.

Methods in which chopped off metal wire pieces are applied to an overheated plate and immediately evaporate there, so-called flash vapor deposition, solve the material feed problem. However, it is not possible to attain an adequate evaporation rate due to the material being fed in the solid phase and the need for temperatures significantly higher than the evaporation temperature on each piece of wire.

The equally well-established method of thermal spraying, especially the process variant of the wire arc spraying method, is a cost-effective and flexible method for batch galvanizing of components. In this method, an electric arc is held between an anodically and a cathodically switched wire or such electrodes and evaporates a small portion of the material at the ends of the wire and liquefies a larger portion. A gas jet tears the liquid material from the wire ends and accelerates it onto the surface to be coated. Since the molten droplets are very small, they harden very rapidly when they impinge on the cold substrate surface and form a lamellar structure that is quite porous compared to the previously described methods. To attain sufficient anti-corrosion effect, therefore, layers having thicknesses between 70 µm and 150 µm must be deposited. The required layer thicknesses are thus greater, by a factor of 10 to 20, than in the methods typically used in band methods, so that thermal spraying is unsuitable for band coating or large surfaces simply for reasons of resource efficiency. In addition, surfaces produced by thermal spraying in general are too rough for automobile applications and therefore post-processing would be necessary. In addition, the deficient adhesion with many material combinations is a problem.

The underlying object of the invention is to provide options with high coating rates, in a coating method for coating surfaces using vapor deposition that is easily controlled and/or regulated, with continuous material feed, especially also for high melting point materials or alloy systems such as e.g. iron-magnesium-zinc.

According to the invention, this object is attained with a device that has the features of the claims set forth herein.

In the inventive device, at least one wire-shaped or band-shaped material used for forming the respective coating may be fed to the area of influence of an electric arc that is formed between two wire-shaped or band-shaped elements or between a cathode and an anode that are connected to a direct electrical current source. The arc may be formed between wire-shaped or band-shaped elements that are formed with the material(s) that are used for forming the coating.

This unit may thereby be embodied comparable to a spray head. The material melted and/or evaporated by means of the energy from the arc flows, by means of a gas jet of a gas or gas mixture, through an inlet into the interior of a chamber that can be heated to a temperature that is at least equal to the evaporation temperature of the at least one material to be used for the coating or of the material with the respectively highest evaporation temperature. Thereby, the material(s) completely evaporate(s) in the chamber and exit(s) through an opening present in the chamber. Thereby, the evaporated material(s) impinge(s) on the surface to be coated of the component, band-shaped material, or tool for forming the respective coating.

Since the temperature on the surface of the component, band-shaped material, or tool is a much lower temperature, the impinging material transitions to the solid aggregate state. If a plurality of materials are used in this manner, an in situ alloy formation may occur, which is in particular advantageously possible for metals with which it is not possible to form alloys, or is only possible to form alloys with great difficulty, with other methods.

The atmosphere within the chamber should be oxygen-free if there is no desire for a coating containing an oxide. To ensure freedom from oxygen and to lower the evaporation temperature of the material fed, the pressure within the chamber should be reduced compared to the ambient pressure, preferably to a pressure that corresponds at a minimum to the pressure at which water evaporates. In this way it is possible to use an inexpensive water ring pump that is not sensitive to dusts.

The material may advantageously be fed, via controllable drive rollers, with one or a plurality of wire(s) or band(s) of the material(s) to be coated. The material may be stored under ambient conditions and then preferably may be fed per continuous airlock technology to the arc melting or vapor deposition process occurring under vacuum conditions or in an oxygen-free atmosphere.

Here, wire-shaped or band-shaped materials having a different thickness and composition, including flux-cored wires, may be used. In this way, homogeneous alloy layer systems having almost any desired material composition may be formed on surfaces of components, band-shaped materials, or tools. The quantity and number of the alloys used may be practically expanded as desired using a plurality of arcs with gas jet supply and feeding of wire-shaped or band-shaped material that is added to a chamber. Uninterrupted operation, even for weeks, may be assured by welding wire-shaped or band-shaped material together under atmospheric conditions to create a quasi-continuous wire.

The wire-shaped or band-shaped material used for forming the coating may be melted or partially evaporated using an electric arc that is formed between wire material or band material and a water-cooled cathode or anode. The wire-shaped material(s) should advantageously be supplied at a flat (acute) angle, similar to an arc wire spray head, relative to one another or relative to an anode or cathode. The angle should preferably be in the range of 30°.

However, an arc for melting and/or evaporating the wire-shaped or band-shaped material may also be formed between at least two wire-shaped or band-shaped materials. The wire-shaped or band-shaped materials then form the cathode and anode that are connected to a direct electrical current source.

An arc may also be formed, however, between a wire-shaped or band-shaped material that is connected to an electrode of a direct electrical current source and a cathode or an anode, the material of which is not melted or even evaporated by the arc. The wire-shaped or band-shaped material connected to the electrode of the direct electrical current source thus forms an anode or cathode and the complementary electrode, that is, the cathode or anode, is formed with a non-melting material.

At the same time, a preferably oxygen-free gas jet (preferably nitrogen or argon) may be passed by in the longitudinal direction at the ends of the wire-shaped or band-shaped material or of the wire-shaped or band-shaped materials that are arranged in the area of influence of the electric arc. The gas jet tears tiny molten droplets from the end-face ends of the material and drives them and the resulting material vapor out through a nozzle-like opening and through an inlet into the interior of the chamber.

The wire-shaped or band-shaped material to be evaporated or the materials to be evaporated (e.g. Fe, Zn, Al, Mg, or alloys with the same) may be present in the shape of wires having a diameter, or a width of a band, in the range of a few millimeters. One wire-shaped or band-shaped material may be connected to the anode, the other to the cathode of a direct electrical current source that is able to supply electrical currents between 20 A and 200 A at an electrical voltage between 10 V and 80 V. The electrical voltages and currents selected depend on the materials to be evaporated. For Fe, e.g. U=30 V and I=80 A may be used. The contacting is advantageously embodied from well-conducting material (copper) in the form of rods with through-holes so that wire-shaped material may be guided through the bore. This permits good electrical contacting and guidance of the wire-shaped material such that its ends meet. For band-shaped material, a slit may be used instead of a bore.

If an electrical voltage is applied, an electric arc ignites between the ends of the wire-shaped or band-shaped materials if they are connected to the anode and a cathode of a direct electrical current source. Because of this, wire-shaped or band-shaped material is at least partially melted and may partially evaporate. Therefore, for maintaining the light arc, wire-shaped or band-shaped material must continue to be supplied, which may be attained with a feeding device. The wire-shaped or band-shaped material and the electrical contacting enclosing it may advantageously be held in a block made of temperature-resistant and electrically insulating ceramic. In order to completely evaporate the partially melted, partially evaporated material, the latter is torn forward towards a chamber by a stream of a gas with which the material to be evaporated does not react, e.g. argon, and is conveyed in or through a heating device. The ceramic block is advantageously connected to the heating device by a tube in order to convey gas, molten material, and evaporated material into the heating device loss-free.

The heating device may advantageously comprise high temperature resistant, electrically conductive material, and may particularly advantageously comprise graphite, and may have a cylindrical shape (crucible/chamber). The connecting tube to the ceramic block should be attached such that the material may be fed in tangentially so that after being fed into the crucible the material circles in the shape of a circular flow. The melted material particles that have not yet evaporated have a higher density than the gaseous evaporated material. The material particles may be urged outward by the circular flow, toward the interior crucible wall, along which they circle and thus absorb the energy required for complete evaporation from the heat of the crucible. There may be a cover on the crucible, in the center of which cover a round tube has been added that dips axially into the crucible interior (dip tube) and is open at both ends.

The portions of the material that are already in vaporous form may leave the crucible in an upward direction. Advantageously arranged above the upper opening of the tube are the surfaces to be coated; this may be e.g. band-shaped material that is moved over the opening continuously. To increase the range of the vapor and prevent recondensation of the material, the described device may advantageously be operated in a chamber in which there is negative pressure. In principle the crucible may be heated in a variety of different manners. Inductive heating is advantageous. For this purpose, the crucible may be enclosed by an inductor that has an adapted impedance and may advantageously be operated in the range of a few kHz. The inductor is advantageously completely enclosed by a material that ensures the thermal and electrical insulation of the inductor. This may be, e.g., concrete. To prevent loss of heat by heat radiation, the crucible should be enclosed by thermally insulating material. The crucible temperature must be selected such that the boiling point of the material to be evaporated is exceeded. This is, e.g., 1200° C. for Zn, or the material to be evaporated already has a marked vapor pressure at the prevailing negative pressure (e.g., 2600° C. for Fe).

For increasing the evaporation rate and/or for evaporating different materials, the crucible may advantageously be equipped with a plurality of the devices described in the foregoing for supplying molten and evaporated material.

The electrical current sources with high melting capacity that are known for wire arc spraying may be used for forming the electric arc. Different types of electric arcs may be used depending on the material(s) used. In contrast to conventional spray processes, the goal should be the highest possible evaporation rate of the material to be evaporated. This should also be supported by minimizing the volume flow that is selected during the feeding of the gas jet. The gas or gas mixture with which the gas jet is formed should advantageously be fed preheated within the chamber to minimize the gas quantity and the energies necessary in the subsequent evaporation process. This may occur e.g. using a spiral in the heating area of the inductor. The gas jet may thus flow through the area of influence of the inductor and be heated thereby.

The mixture of gas jet, evaporated material, and extremely fine molten droplets is added to the heated chamber. The temperature within the chamber must be at least equal to the evaporation temperature of the evaporated material that has the respectively highest evaporation temperature that is used for forming the coating, so that the remaining small molten droplets of the material may be completely evaporated within the chamber. The evaporation temperature and thus the chamber temperature required may be significantly reduced by using a negative pressure. This is necessary and advantageous for a few high melting point materials, because otherwise there are no suitable materials available for the chamber wall. A negative pressure that corresponds at a minimum to the pressure at which water evaporates is advantageous for still being able to use cost-effective water ring pumps that are resistant to dusts to create the vacuum.

At least one spray head may be present on the chamber or at least one spray head may also be connected to the chamber. Thereby, the spray head should have the elements that are necessary for forming an arc and gas jet. The elements for feeding wire-shaped or band-shaped materials may also be components of a spray head.

A spray head may be arranged such that the nozzle of the spray head is disposed in the chamber or an injector tube may be arranged between spray head and chamber wall. Naturally a plurality of spray heads may be arranged on a chamber, as well.

The gas-vapor droplet stream flowing out through the nozzle of the spray head hereby prevents evaporated material from penetrating into the spray head. In order to prevent accumulation on the nozzle, the temperature of the nozzle of the spray head should be at least equal to the melting point of the high melting point material fed. The evaporation temperature is to be attained here as well. Therefore the nozzle and the spray head and possibly the injector tube should preferably be fabricated from high temperature-resistant, insulating ceramic material or from a mixture of graphite components and insulating ceramic material. Boron nitride is preferred for the ceramic material. Water-cooled contact elements, preferably made of copper, should be integrated into the spray head for electrically contacting the band-shaped or wire-shaped materials. The mechanical energy or the geometric form of the out-flowing gas-vapor droplet stream may be influenced by embodying the opening in the shape of a conically decreasing or enlarged nozzle.

Due to its good temperature resistance, heat conductivity, and electrical conductivity, graphite should preferably be used as the material for the chamber wall. Depending on the material(s) to be evaporated, for forming coatings it is possible to combine high temperature-resistant ceramic materials that are resistant to melt, e.g. boron nitride, with iron and aluminum, preferably in the form of a partial or complete lining.

The chamber may preferably be heated, using induction heating, to or greater than the evaporation temperatures. For insulation at temperatures >2000° C., a combination of graphite wool and aluminum oxide-lined, water-cooled copper inductors are preferred here. However, it is also possible for heating to occur using CFC resistance heat elements in or outside of the chamber.

To minimize the required chamber temperature and at the same time prevent molten droplets from exiting the interior of the chamber and ensure that the molten droplets remain or flow along the heated outer walls of the chamber for as long as possible, the wall of the chamber may form channels through which the molten and/or evaporated material flows via a lengthy path and for an extended period of time. The chamber wall may advantageously be embodied in the form of a cyclone separator. The material to be coated should glide within the chamber, as on an air cushion, on the gas and/or vapor stream and the vapor formed within the chamber should be guided such that all of it can deposit on the surface to be coated. This may advantageously be influenced and adjusted using a suitable opening or nozzle shape through which the evaporated material is guided out. In any case, direct contact between chamber wall and material to be coated should be prevented, because this can lead to damage to the coating to be formed and/or to coating of the chamber wall.

If complete deposition of the vapor stream as coating on the surface of a component, band-shaped material, or tool is not possible in the direct impingement area of the vapor, the material used for the coating may be guided above the opening of the chamber in a hot channel.

The alloy composition of the coating vapor-deposited above the opening of the chamber may be controlled or regulated as desired and rapidly using different advancing speeds with which wire-shaped or band-shaped material is fed to the electric arc in combination with suitable arc parameters and by turning on and off.

In this way the quantity of the evaporated material(s) used for forming the coating may be adapted to the advancing speed at which the surface to be coated is moved along.

If larger surface regions or specific surface regions are to be coated, a plurality of openings may be present on one chamber, and the evaporated material may be directed through them onto the surface to be coated. There may also be a plurality of arcs, with feed for a gas jet and wire-shaped or band-shaped material(s) present in one chamber. It is also possible for a plurality of chambers to be connected to one another, e.g. using a longitudinal pressure chamber.

For certain layering systems with which a coating is to be formed on a surface of a component, band-shaped material, or tool, an additional ionization of the outflowing vapor, as it is known from the field of electron beam vapor deposition, may cause an improvement in the layer properties.

If the component, band-shaped material, or tool is heated sufficiently and/or the vapor is ionized and possibly accelerated, the vapor-deposited materials may be alloyed in or the coating is alloyed through the base material.

There is also the advantageous option of adjusting the surface of a band-shaped material that is to be coated to the surface of the chamber, at least in the area of the opening, by means of the kinetic energy of the outflowing vapor-gas flow. This can create a gas cushion that significantly reduces friction and therefore a smaller distance may be maintained, so that loss of coating material may be reduced or even entirely prevented.

The invention is explained in greater detail in the following using an example.

FIG. 1 is an example of an inventive device for forming a coating on a surface of a component.

FIG. 1 depicts a device for forming a coating on a surface of a component 7, in this case a band-shaped material made of steel.

A wire-shaped material 2.1 and 2.2 is fed in using drive rollers (not shown) such that an arc 2 can form between these wires if one wire is formed as a cathode 2.1 by means of a direct electrical current source and one wire is formed as an anode 2.2. This evaporates and/or at least melts the end-face ends.

A gas jet 1 of a gas or gas mixture that is preferably heated to a temperature of at least 600° C. and that does not contain any oxygen, is fed into this area with a volume flow that is sufficient to drive the molten and/or evaporated material 2.1 and 2.2 through an injector tube 3 into the chamber 4 embodied as a cyclone.

The gas-vapor droplet mixture is driven into the chamber 4 embodied as a cyclone such that a rotational flow forms in at least one channel 6 between chamber wall 4 and a dip tube 9. This causes the molten droplets present to deposit on the heated outer wall of the chamber 4 and evaporate there, and a gas-vapor stream is conveyed to an opening 5 that is arranged in the area of the dip tube 9.

The surface of the component 7 to be coated is disposed outside of the chamber 4 at a slight distance from the opening 5 and during the formation of the coating is moved translationally or rotationally at an appropriate advancing speed so that the entire surface provided for coating may be coated.

No depiction is provided of a feed device for the wire-shaped material, which device feeds by means of at least two rollers, of which at least one should be drivable.

The channel(s) 6 is/are embodied such that the path from the electric arc 2 to the opening 5 is extended and molten droplets remain on the heated wall due to a rotational flow in order to extend the contact time between the evaporated material(s) and the heated wall and to prolong the dwell time in the chamber 4. Since the wall of the chamber 4 has been heated, at the pressure maintained in the chamber 4, to greater than the evaporation temperature of the material 2.1 and 2.2, with which the coating is to be formed, by means of an induction heater 8 enclosing the chamber 4 from outside, it is possible to evaporate all of the material 2.1 and 2.2 used for the coating before it exits from the opening 5 and impinges on the surface of the component 7 to be coated. In this way it is possible to attain in particular a coating of the wall of the chamber 4 and at least nearly complete exhaustion of the material used for forming the coating. With complete evaporation, it is also possible to prevent exiting droplets that would deposit in the coating and would lead to worsening of the surface quality. Using a cone-shaped embodiment of the chamber floor 10 it is possible to prevent any molten droplets at all from exiting, even if the temperature is selected incorrectly.

As already stated in the foregoing, the pressure in the interior of the chamber 4 should be reduced relative to the ambient pressure in order to be able to reduce as much as possible the temperature required for complete evaporation of the material.

In this example, the wall of the chamber 4 is made of graphite. For materials whose melts act on graphite, at least parts of the chamber 4 may be lined with ceramic materials, e.g. boron nitride. In this way it is even possible to use materials that cannot be used with pure graphite for forming the coating.

The invention claimed is:

1. A device for forming coatings on surfaces of a component, band-shaped material, or tool, in which at least one wire-shaped or band-shaped material used for forming the coating forms a cathode and/or an anode that are connected to a direct electrical current source and between which an electric arc is formed, wherein wire-shaped or band-shaped material is fed by means of a feed device; and melted and/or evaporated material of the wire-shaped or band-shaped material used for forming the coating on said surfaces flows, by means of a gas jet of a gas or gas mixture, through an inlet into the interior of a chamber, said chamber having a wall embodied as in the shape of a cyclone separator, such that the material to be coated should glide within said chamber, as on an air cushion, on the gas and/or vapor stream that flows within said chamber, wherein said chamber is heated to a temperature that is at least equal to the evaporation temperature of the at least one material used for the coating or of the material with the respectively highest evaporation temperature and the material to be coated on said surfaces completely evaporates and exits through at least one opening present on the chamber and impinges on the surface to be coated of the component or tool for forming the respective coating; and wherein the chamber is in a cylindrical shape, and wherein a dip tube is co-axial with the chamber and the dip tube has an annual opening at bottom and one center opening at top, an annular channel is formed between the wall of the chamber and the dip tube, through which evaporated material and material still to be evaporated are guided downward to the bottom annual opening with an extended path within an extended period of time, and then flow upward through the dip tube and exit at top center opening, wherein the inlet to the chamber is attached such that the wire-shaped or band-shaped material is fed into the annual channel tangentially forming a rotation flow within said annular channel.

2. The device according to claim 1, characterized in that the atmosphere in the chamber and on the opening is maintained oxygen-free in the case where no coating containing oxide is to be formed.

3. The device according to claim 1, characterized in that, for reducing the evaporation temperature and/or ensuring freedom from oxygen, the pressure within the chamber is less than the ambient pressure.

4. The device according to claim 1, characterized in that the chamber is heated by means of an inductive heating unit formed around the chamber or integrated in the material of the chamber wall.

5. The device according to claim 1, characterized in that the gas or gas mixture flows through the heating area of an inductor to heat it.

6. The device according claim 1, characterized in that a spray head is fabricated from high temperature-resistant ceramic material, and contact elements for the band-shaped and/or wire-shaped material(s) are water-cooled copper elements.

7. The device according to claim 6, wherein the spray head is fabricated from boron nitride or a mixture of born nitride components and graphite components.

8. The device according to claim 1, characterized in that two band-shaped or wire-shaped materials are formed from at least two different materials and/or a flux-cored wire.

9. The device according to claim 1, characterized in that the chamber wall is formed from graphite or graphite combined with a ceramic material.

10. The device according to claim 9, the ceramic material is boron nitride.

11. The device according to claim 1, characterized in that a plurality of openings are present on a chamber.

12. The device according to claim 1, characterized in that a plurality of arcs are embodied on spray heads within the chamber.

13. The device according to claim 1, characterized in that the quantity of wire-shaped or band-shaped material influences the thickness and composition of a coating.

14. The device according to claim 1, characterized in that the quantity of material to be evaporated relative to the quantity of the molten material during the arc melting process is may be influenced by influencing the volume flow of the gas jet.

15. The device according to claim 1, characterized in that, for insulating the chamber at temperatures >2000° C., a combination of graphite wool for the chamber wall and aluminum oxide-covered, water-cooled copper inductors is used for an induction heating unit.

16. The device according to claim 1, characterized in that an opening is embodied in the shape of a conically decreasing or enlarged nozzle.

17. The device according to claim 1, characterized in that the distance between the surface of a band-shaped material to be coated and the surface of the chamber is adjustable, at least in the area of the opening, by means of the kinetic energy of the outflowing vapor-gas stream.

* * * * *